Figure 1:
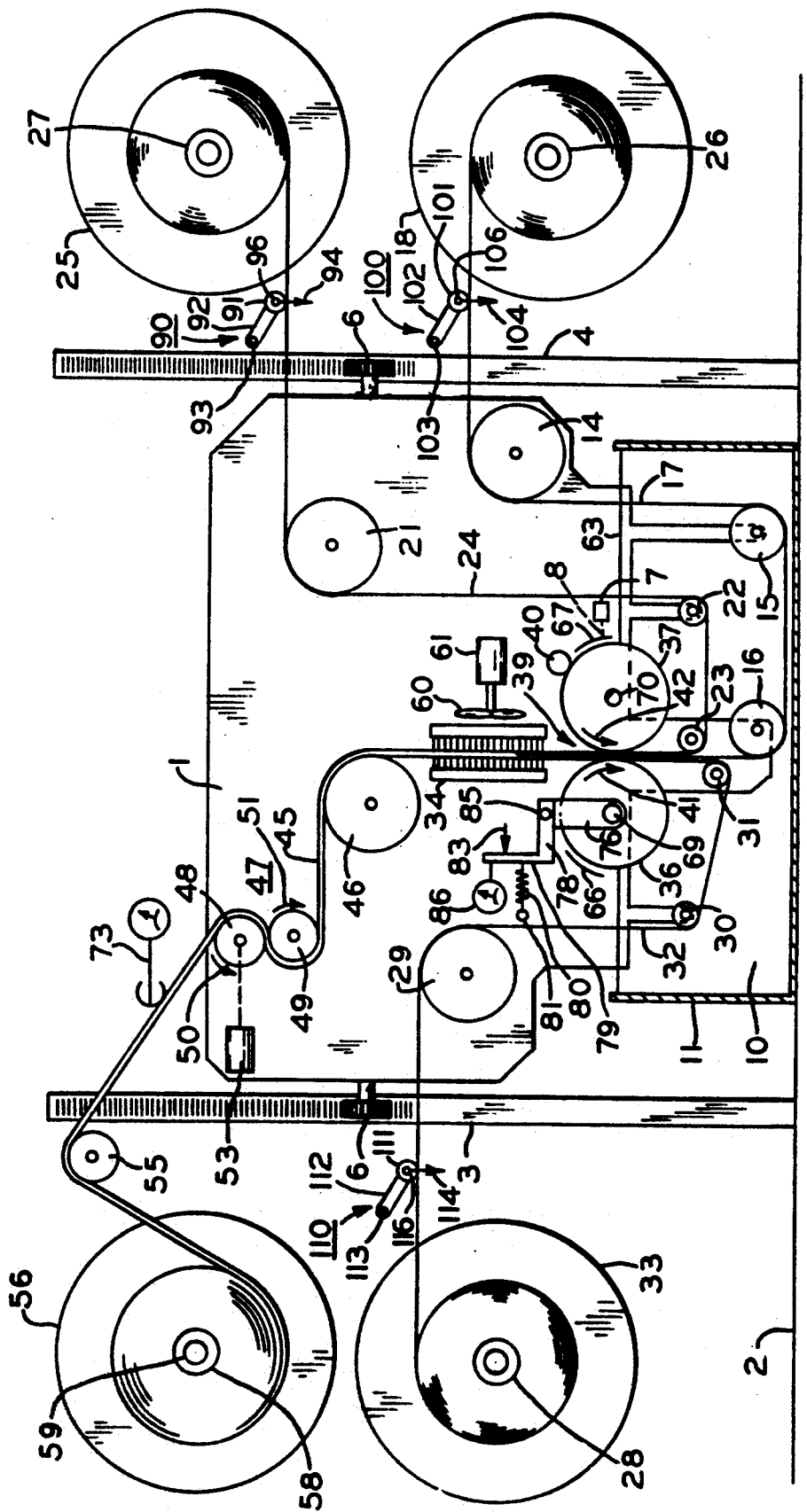

United States Patent [19]

King et al.

[11] Patent Number: 5,299,728
[45] Date of Patent: Apr. 5, 1994

[54] METHOD AND APPARATUS FOR LAMINATING FOILS INTO A SUPERCONDUCTING TAPE FOR USE IN A SUPERCONDUCTING MAGNET

[75] Inventors: Christopher G. King, Florence; Gerhard S. Kobus; Anthony Mantone, both of Effingham; Malvin L. Dennis, Lake City; Frank D. Shaffer, Quimby; Richard A. Stephens, Pamplico; Neil G. Fiddes, Columbia, all of S.C.

[73] Assignee: General Electric Company, Milwaukee, Wis.

[21] Appl. No.: 967,316

[22] Filed: Oct. 28, 1992

[51] Int. Cl.$^5$ ............................................. H01B 12/00
[52] U.S. Cl. ............................... 228/179.1; 228/259; 505/887; 505/927
[58] Field of Search ............... 228/179, 259; 29/599; 505/916, 927, 915, 887

[56] References Cited

U.S. PATENT DOCUMENTS

| | | | |
|---|---|---|---|
| 3,458,293 | 7/1969 | Schindler | 29/599 X |
| 4,078,299 | 3/1978 | Furuto et al. | 29/599 |
| 4,411,712 | 10/1983 | Marancik | 29/599 X |

Primary Examiner—Kenneth J. Ramsey
Attorney, Agent, or Firm—Irving Freedman; James O. Skarsten

[57] ABSTRACT

Apparatus and method for forming long lengths of laminated superconducting tape by passing three foils over idler pulleys, through a solder bath and between pinch rollers having a portion which extend above the solder bath to enable cleaning of the pinch rollers during the formation of the superconducting tape with means to adjust the pressure applied by the pinch rollers, and to adjust the laminated tape takeup tension independently from the foil process tension.

20 Claims, 1 Drawing Sheet

METHOD AND APPARATUS FOR LAMINATING FOILS INTO A SUPERCONDUCTING TAPE FOR USE IN A SUPERCONDUCTING MAGNET

BACKGROUND OF THE INVENTION

This invention relates to a method and apparatus for manufacturing laminated tapes suitable for use in superconducting magnets.

As is well known, a magnet can be made superconducting by placing it in an extremely cold environment, such as by enclosing it in a cryostat or pressure vessel containing liquid helium or other cryogen. The extreme cold reduces the resistance in the magnetic coils to negligible levels, such that when a power source is initially connected to the coil (for a period, for example, of ten minutes) to introduce a current flow through the coils, the current will continue to flow through the coils due to the negligible coil resistance even after power is removed, thereby maintaining a magnetic field. Superconducting magnets find wide application, for example, in the field of magnetic resonance imaging (hereinafter called "MRI").

Considerable research and development efforts have been directed at eliminating the need for a boiling cryogen, such as liquid helium, and in providing superconducting magnets which maintain the magnetic state and do not "quench," or discontinue superconductivity. However, the differential thermal expansion and contraction between materials in superconducting magnets, which are cycled from ambient temperature to temperatures in the range of absolute zero ($-270°$ C.), and the extremely large magnetic forces provided, and utilized, in an MRI lead to conflicting characteristics required of the materials used in MRI tapes. In addition, the desired superconducting magnet material such as $Nb_3Sn$ is often relatively brittle and difficult to handle in winding coils.

Improved materials for use in superconducting magnets and associated superconducting switches are disclosed in United States patent applications of Bu-Xin Xu, R. Jaykumar and John Wollan, entitled "Persistent Superconducting Switch for Conduction-Cooled Superconducting Magnet," serial number 001,692 filed Jan. 7, 1993, and the patent application of Bu-Xin Xu and John Wollan, entitled "Stable Flux-Jumping Resistant Superconducting Tape and Superconducting Magnet," application serial number 984,819 filed Dec. 3, 1992, both of which are assigned to the same assignee as the present invention. The subject patent application is particularly suitable for use in winding superconducting coils and superconducting switches of the type disclosed in the aforementioned copending patent applications.

However, the manufacture of laminated tape suitable for superconducting use involves the lamination of long lengths of different materials such as niobium tin ($Nb_3Sn$) and copper by applying pressure while the $Nb_3Sn$ and copper foils are fed through a molten solder bath and pinched together. A persistent problem encountered in such a process is contamination at the pinch point by debris and copper particles or compounds in the solder bath. Also, the tension required for feeding the thin foils through the solder bath and pinch point is different than the tension required for proper spooling of the resultant laminated tape onto a takeup spool.

It is highly desirable to be able to clean the pinch point or compression mechanism without lifting the mechanism out of the solder bath and while the process continues in operation. In addition, it is important to provide a uniform and carefully controlled laminated tape through control of the pressure exerted on the foils at the pinch point. Still further, it is highly important that the feed mechanism be reliable, be able to handle the extremely thin foils involved, and that provision be included for ease of replacement and/or repair of components in order to decrease process down-time for repair or maintenance purposes.

OBJECTS AND SUMMARY OF INVENTION

It is an object of the present invention to provide an improved apparatus and method for the fabrication of superconducting tape suitable for use in superconducting magnets and superconducting switches.

It is another object of the present invention to provide an improved apparatus and method for producing superconducting tape which is suitable for use with thin foils of material, including brittle material.

It is yet another object of the present invention to provide an improved apparatus and method for the fabrication of superconducting tape in which the process parameters, including the pressure applied to the lamination of the tape, can be selectively controlled.

Still another object of the present invention is to provide an improved apparatus and method for the fabrication of superconducting tape utilizing a pinch point within a liquid solder bath which can be cleaned of contaminants and debris without disruption of the process.

Yet a still further object of the present invention is to provide an improved apparatus and method for the fabrication of superconducting tape in which the tension applied to the thin foils which are laminated in the process is different than the tension applied to the takeup spool on which the laminated tape is fed, notwithstanding a single tape drive.

Another object of the present invention is to provide an improved apparatus and method for the fabrication of superconducting tape in which the feed mechanism may be selectively and controllably immersed in the liquid solder bath, and which can be readily removed for repair or replacement.

In accordance with one form of the invention, a first foil, which may be $Nb_3Sn$, is spooled from a supply spool past idler pulleys and through the pinch area in a molten solder bath. A second foil, which may be copper, is spooled from a second supply spool through the molten solder bath and positioned contiguous to the first foil at the pinch area through use of idler pulleys. A third foil is passed from a third supply spool past idler pulleys and through the molten solder bath to be positioned Contiguous to the first foil at the pinch area in order to form a laminated three-layer tape at the pinch area by the pressure exerted by pinch rollers. The pinch rollers provide pressure at the pinch area between the pinch rollers, but include portions which extend above the surface of the molten solder to enable periodic or continuous cleaning of the pinch rollers in the region outside the molten solder bath during the operation of the process.

The laminated three-layer tape is then wound onto a motor driven tape spool, the rotation of which provides the tension to pull the first, second and third foils through the molten solder bath, past the pinch rollers and onto the takeup tape spool. One of the pinch rollers is adjustably controlled to provide the desired pressure on the foils in the pinch area, and cooling air is provided to the laminated tape as it emerges from the molten solder bath.

The tension applied to the foils in passing from their respective supply spools through the molten solder and between the pinch rollers can be adjusted by the motor driven payoff or supply spool, while the tension applied to the laminated tape for purposes of spooling onto the takeup spool, is independently controlled by a pair of tension rollers which feed the laminated tape around them in a substantially S-shaped path because of the counter-rotation of the tension rollers. A magnetic brake is applied to one of the tension rollers to selectively and independently control the spooling tension. A moveable tape placement wheel is positioned near the tape takeup spool to control the placement of the laminated tape on the tape takeup spool.

The supply spools, idler pulleys and pinch rollers are supported on a moveable frame to selectively position or remove the apparatus from its operative position within the molten solder bath. Means are provided through parallel support rails to raise or lower the frame relative to the molten solder bath, facilitating repair of the apparatus or replacement of the feed mechanism and minimizing down-time of the process in the event of problems.

BRIEF DESCRIPTION OF INVENTION

FIG. 1 is a side view, partially in section, showing the present invention.

Referring to FIG. 1, base or frame 1 is supported on work surface 2 between a pair of vertical support rails 3 and 4, to enable the frame to be selectively raised or lowered by a motor driven gear arrangement shown generally as 6, meshing with teeth in the vertical support rails or alternatively by a linear slide assembly with a counter weight balance arrangement. FIG. 1 shows the present invention in its operative position relative to the molten solder bath 10 contained within its receptacle 11 and heated by suitable heating controls (not shown) which are well known in the art.

Rotatably mounted on frame 1 is a first set of idler pulleys 14, 15 and 16 around which a first foil 17 of niobium tin ($Nb_3Sn$) is fed from first supply spool 18 rotated by motor 26 to pass around idler pulleys 14–16 and through pinch area 39. Similarly, idler pulleys 21, 22 and 23 are rotatably mounted on frame 1 and the second foil 24, which is copper, is fed from second supply spool 25 rotated by motor 27 to pass around idler pulleys 21–23 to move contiguous to first foil 17 at pinch area 39. In a like manner, third foil 32, which is also copper, is fed from third supply spool 33 rotated by motor 28 to pass around idler pulleys 29, 30 and 31, rotatably mounted on frame 1 to move contiguous to first foil 17 on the side remote from second foil 24 at pinch area 39. Supply spools 18, 25 and 33 may be mounted on frame 1 or alternatively may be mounted external to frame to accommodate a large size supply spool because of the long length commonly required and utilized in the fabrication of superconducting magnets.

The three contiguous moving foils 17, 24 and 32 are passed between pinch rollers 36 and 37, which are rotatably mounted on frame 1 and form a pinch area indicated generally by arrow 39 between the substantially touching circumferences of the pinch rollers. Pinch rollers 36 and 37 are driven in opposite directions, indicated by arrows 41 and 42, by drive gear 40 driving gears mounted on the end surfaces of the pinch rollers. The axis of rotation of pinch roller 37 is stationary. A spring-loaded adjustable pressure mechanism 80 urges pinch roller 36 toward pinch roller 37 and is controlled to provide the desired pressure in pinch area 39 to compress foils 24 and 32 onto foil 17 to provide a three-layer laminated or sandwiched conductor tape 45 of the desired characteristics. Adjustable pressure mechanism 80 includes a crank or lever arm 76 fastened to shaft 69 of pinch roller 36. Crank arm 76 is connected to adjustment arm 79 by connecting arm 78 such that movement of the adjustment arm in the direction shown by arrow 83 will cause pinch roller 36 to rotate around axis 85 to move toward pinch roller 37 to increase pressure through pinch area 39 on foils 17, 24 and 32. Movement of adjustment arm 79 may be controlled by an adjustable spring pressure control shown generally as 80 which is secured at the remote end 81 to frame 1. An indicator 86, which may be a strain gauge indicator, indicates the magnitude of the pressure of pinch rollers 36 and 37 and is used in selectively controlling the pressure to that desired. A pressure of approximately 5 pounds has been found to be suitable.

The tension in advance of pinch rollers 36 and 37 on foils 17, 24 and 32 may be conveniently and selectively controlled by the use of weighted tension rollers. One suitable foil tension adjustment means 90 is shown positioned between second supply spool 25 and its associated idler pulley 21. Tension roller 91 is pivoted on arm 92 about axis 93 to press against second foil 24. A weight shown as arrow 94 is suspended from axle 96 of roller 91 and is selected to provide the desired tension for second foil 24. Foil tension adjustment means 100 is similarly positioned between first supply spool 18 and its associated idler pulley 14, and includes roller 101, pivotted arm 102, and weight 104 providing selected pressure on first foil 17 to control its tension. Tension adjustment means 110 is similarly positioned between third supply spool 33 and its associated roller pulley 29, and includes roller 111, pivotted arm 112 and weight 114 providing selected pressure on third foil 32 to control its tension.

Laminated conductor tape 45 passes around idler pulley 46, also rotatably mounted on frame 1, through adjustable tension means 47. Adjustable tension means or tension isolater 47 comprises a pair of contiguous pulleys 48 and 49, rotating in opposite directions as shown by arrows 50 and 51, with the laminated conductor tape 45 moving around the left side of pulley 49, between pulleys 48 and 49, and around the right side of pulley 48, to pass through the adjustable tension means in a substantially S-shaped configuration.

Adjustable brake 53, which may be a magnetic brake applies a controlled braking to pulley 48 to selectively control the tension applied to laminated conductor tape 45 in the region of takeup spool 56 to control the spooling tension and hence tightness of the laminated conductor tape wound on the takeup spool. Takeup tension indicator or measurement device 73 facilitates adjustment of adjustable brake 53 to obtain the desired tension of the laminated conductor which is independent of the process tension applied to foils 17, 24 and 32 and to laminated conductor tape take 45 in the region of pinch rollers 36 and 37 prior to adjustable tension means 47. This enables control of the tightness and compactness of the layers of laminated conductor tape 45 wound on takeup spool 56.

Laminated conductor tape 45 then passes around moveable tape placement wheel 55 to be spooled onto tape takeup spool 56, which because of its large diameter is mounted external to frame 1. A variable speed motor 58 is connected to shaft 59 of tape takeup spool 56 to rotate the tap takeup spool and provide tension through laminated conductor tape 45 to foils 17, 24 and 32 to cause the movement of foils 17, 24 and 32 from their respective supply spools 18, 25 and 33 around their associated idler pulleys, through molten solder bath 10, and past pinch area 39 between pinch rollers 36 and 37, to form laminated conductor tape 45 which is subsequently pulled onto takeup spool 56. Tape placement wheel 55 is controlled to move in a direction parallel to shaft 59 of tape takeup spool 56 to control the placement of laminated conductor tape 45 into multi-turn layers on the tape takeup spool.

A fan 60 driven by electric motor 61 may be provided to cool laminated conductor tape 45 with cooling air as the laminated conductor tape passes out of the molten solder bath, past pinch rollers 36 and 37, and through the air quench tubes of quench assembly 34.

It is to be noted that pinch rollers 36 and 37 partially extend above the surface 63 of solder bath 10. A major problem in the solder bath lamination process is maintaining the lamination area or pinch area 39 free of foreign material or particles that can cause wear on the pinch rollers or damage foils 17, 24 and 32 as they pass through the pinch area. With the arrangement shown in FIG. 1, it is possible to clean the surfaces of pinch rollers 36 and 37 while the process is in operation by cleaning the exposed areas of the pinch rollers above surface 63 of solder bath 10. This may be accomplished by wiper shoes or pads 66 and 67 positioned adjacent and in contact with pinch rollers 36 and 37. Silicone rubber pads may be used for wiper pads 66 and 67. Alternatively, pinch rollers 36 and 37 may be cleaned manually with a razor blade, abrasive pads sold under the trade name ScotchBrite by the 3M Company, or by a motorized steel brush or pad. A motorized steel brush may be mounted with a cam drive so that it orbits in and out and across the surface of pinch rollers 36 and 37 in the direction of their axes 69 and 70, respectively. Motor 7 is shown connected through cam drive 8 to pad 67.

In one embodiment of the subject invention, idler pulleys or rollers 22, 23, 30 and 31 are one-inch diameter flanged tool steel rollers, 15 and 16 are two-inch diameter flanged tool steel rollers, while 14, 21, 29 and 46 are four-inch diameter, flanged Delrin rollers.

The subject invention has proven to produce superconducting tape exhibiting desired electrical, magnetic and mechanical characteristics required for use in superconducting magnets and superconducting switches. Such tape can withstand extreme electromagnetic and thermal forces or loading, while providing the necessary electrical., magnetic and structural characteristics.

While the present invention has been described with respect to certain preferred embodiments thereof, it is to be understood that numerous variations in the details of construction, the arrangement and combination of parts, and the type of materials used may be made without departing from the spirit and scope of the invention.

What we claim is:

1. A method of forming long lengths of a stabilized superconducting tape comprising:

a pair of contiguous rotatable pinch rollers forming a pinch area therebetween;

spooling a first foil around at least one idler pulley and between said pinch area between said pinch rollers;

spooling a second foil around at least one second idler pulley to pass contiguously to one side of said first foil at said pinch area;

spooling a third foil around at least one third idler pulley to pass contiguously to the opposite side of said first foil at said pinch area, sandwiching said first foil between said second and third foil;

immersing portions of said pinch rollers in a molten solder bath with portions of said pinch rollers extending out of said molten solder bath;

forming a laminated three-layer tape at said pinch area by pressure exerted by said pinch rollers; and selectively cleaning said pinch rollers at the portions of said pinch rollers extending out of said molten solder bath.

2. The method of forming long stabilized superconducting tape of claim 1 wherein said first foil is spooled off a first supply spool, said second foil is spooled off a second supply spool, and said third foil is spooled off a third supply spool.

3. The method of forming long stabilized superconducting tape of claim 2 wherein said laminated three-layer tape is wound onto an electric motor driven takeup tape spool, the rotation of which provides tension to pull said first, second and third foils through said pinch area.

4. The method of forming long stabilized superconducting tape of claim 3 wherein means are provided to control said tension.

5. The method of forming long stabilized superconducting tape of claim 4 wherein multiple idler pulleys are positioned to feed each of said foils in proximity to each other into said pinch area.

6. The method of forming long stabilized superconducting tape of claim 5 wherein a cleaning tool is positioned adjacent each of said portion of said pinch rollers extending out of said molten solder bath and selectively bringing said cleaning tool into contact with the pinch roller adjacent each said cleaning tool.

7. The method of forming long stabilized superconducting tape of claim 6 wherein said cleaning tool is a motorized brush and means are provided to move said brush relative to the adjacent pinch roller.

8. The method of forming long stabilized superconducting tape of claim 1 wherein means are provided to adjust the positioning of one pinch roller relative to the other pinch roller in the region of said pinch area, and adjusting the pressure applied to the formation of said laminated at least three-layer tape at said pinch area by selective movement of said one pinch roller.

9. The method of forming long stabilized superconducting tape of claim 8 wherein meshing gears on said pinch rollers rotate both of said pinch rollers about said pinch area upon the rotation of one of said pinch rollers.

10. The method of forming long stabilized superconducting tape of claim 1 wherein said pinch area is proximate to the surface of the solder in said molten solder bath.

11. The method of forming long stabilized superconducting tape of claim 10 wherein a cooling air flow is directed against said three-layer tape after it passes through said pinch area.

12. The method of forming long stabilized superconducting tape of claim 1 including the additional step of spooling said laminated three-layer tape onto a tape takeup spool.

13. The method of forming long stabilized superconducting tape of claim 12 wherein the rotation of said tape takeup spool draws said foils from said supply spools through said pinch region between said pinch rolls to spool said tape onto said tape takeup spool.

14. The method of forming long stabilized superconducting tape of claim 13 wherein increased tension is provided for the spooling of said tape onto said tape spool as compared with the tension applied to said foils in passing from said supply spools through said pinch region between said pinch rollers.

15. The method of forming long stabilized superconducting tape of claim 14 wherein a tension isolator is positioned between said pinch rolls and said tape takeup spool.

16. The method of forming long stabilized superconducting tape of claim 15 wherein said tension isolator includes a plurality of tension rollers which lead said laminated tape in a first direction of rotation around a portion of a first tension roller and in the opposite direction of rotation around a portion of an adjacent second tension roller, forming a substantially S-shaped path.

17. The method of forming long stabilized superconducting tape of claim 16 wherein an adjustable brake is connected to one of said tension rollers, and selectively applying said brake to control said tension for spooling said tape onto said tape takeup spool.

18. The method of forming long stabilized superconducting tape of claim 17 wherein said brake is a magnetic brake and varying the electric power applied to said magnetic brake to selectively control the spooling tension to be greater than the tension applied to said foils in passing from their respective supply spools and through said pinch area.

19. The method of forming long stabilized superconducting tape of claim 18 wherein a moveable tape placement wheel is positioned near said tape takeup spool and including the additional steps of passing said tape over said tape placement spool; and controlling the movement of said tape placement wheel in a direction parallel to the axis of said tape takeup spool to control the placement of said tape o said tape takeup spool.

20. The method of forming long stabilized superconducting tape of claim 1 wherein said first foil is $Nb_3Sn$, said second foil is copper, and said third foil is copper, and said laminated three-layer tape which is formed is $Nb_3Sn$ sandwiched between layers of copper.

* * * * *